Figure 1:
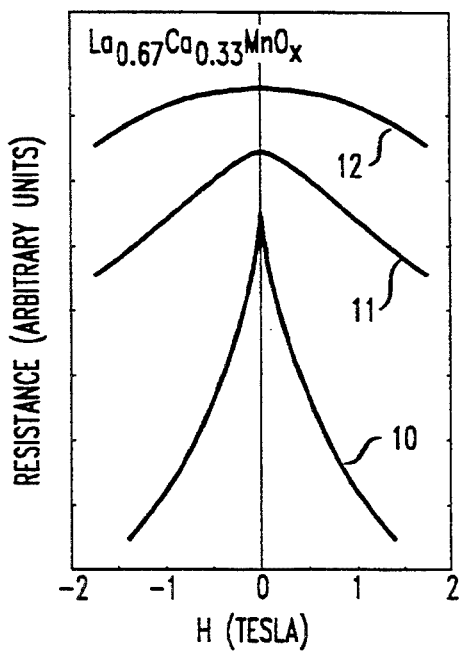

United States Patent [19]

Jin et al.

[11] Patent Number: 5,411,814
[45] Date of Patent: May 2, 1995

[54] ARTICLE COMPRISING MAGNETORESISTIVE OXIDE OF LA, CA, MN ADDITIONALLY CONTAINING EITHER OF BOTH OF SR AND BA

[75] Inventors: Sungho Jin, Millington; Mark T. McCormack, Summit; Thomas H. Tiefel, North Plainfield, all of N.J.

[73] Assignee: AT&T Corp., Murray Hill, N.J.

[21] Appl. No.: 187,668

[22] Filed: Jan. 26, 1994

[51] Int. Cl.$^6$ .............. B32B 9/00; G01R 33/02; H01F 1/00
[52] U.S. Cl. .............. 428/692; 428/694 R; 428/702; 428/900; 252/62.51; 324/252; 338/32 R
[58] Field of Search .............. 428/692, 694 R, 702, 428/900; 252/62.51; 324/252; 338/32 R

[56] References Cited

U.S. PATENT DOCUMENTS 5,068,050  11/1991  Inomata et al. .............. 252/62.51
5,342,704   8/1994  Vasilow et al. .............. 429/31

OTHER PUBLICATIONS

"150% Magnetoresistance in Sputtered Fe/Cr(100) Superlattices", by E. E. Fullerton et al., *Applied Physics Letters*, vol. 63(12), pp. 1699–1701, Sep. 20, 1993.
"Oscillatory Magnetic Exchange Coupling Through Thin Copper Layers", by S. S. P. Parkin et al., *Physical Review Letters*, vol. 66 (16), pp. 2152–2155, Apr. 22, 1991.
"Giant Magnetoresistance in Magnetic Layered and Granular Materials", by P. M. Levy, *Science*, vol. 256, pp. 972–973, May 15, 1992.
"Solid State Magnetic Field Sensors and Applications", by J. Heremans, *J. Phys. D: Applied Physics*, vol. 26, pp. 1149–1168, (1993).
"Magnetoresistance in Magnetic Manganese Oxide with Instrinsic Antiferromagnetic Spin Structure" by K. Chahara et al., *Applied Physics Letters*, vol. 63 (14), pp. 1990–1992, Oct. 4, 1993.
"Giant Negative Magnetoresistance in Perovskitelike $La_{2/3}Ba_{1/3}MnO_x$ Ferromagnetic Films", by R. von Helmolt et al., *Physical Review Letters*, vol. 71 (14), pp. 2331–2333, Oct. 4, 1993.
"The Magnetoresistive Sensor–A Sensitive Device for Detecting Magnetic Field Variations", by U. Dibbern et al., *Electronics Components and Applications*, vol. 5 (3), pp. 148–153, Jun. 1983.

*Primary Examiner*—Stevan A. Resan
*Attorney, Agent, or Firm*—Eugen E. Pacher

[57] ABSTRACT

We have discovered that the addition of a relatively small amount of Sr and/or Ba to La-Ca-Mn-O can yield material of improved magnetoresistive properties at room temperature and in a small applied field, as compared to the analogous Sr and/or Ba-free material. An exemplary composition is $La_{0.55}Ca_{0.25}Sr_{0.08}MnO_x$. Material according to the invention has a substantially larger value of $|d\rho/dH|$ than the analogous comparison material at 25° C. and H≦0.05 Tesla. Preferred compositions also can exhibit a substantially linear dependence of resistivity on applied magnetic field under these conditions, as well as have a relatively large value of zero field resistivity. The novel materials can advantageously be used in applications that involve sensing of a magnetic field, or of changes in such a field.

14 Claims, 1 Drawing Sheet

ARTICLE COMPRISING MAGNETORESISTIVE OXIDE OF LA, CA, MN ADDITIONALLY CONTAINING EITHER OF BOTH OF SR AND BA

FIELD OF THE INVENTION

This invention pertains to magnetoresistive materials, and to articles (e.g., a magnetic field probe or a recording head) that comprise the material.

BACKGROUND OF THE INVENTION

The "magnetoresistance" (MR) of a material is the resistivity $\rho(H)$ of the material in an applied magnetic field (H) minus the resistivity $\rho_o$ of the material in the absence of the applied field. This difference $\Delta\rho$ is typically normalized (e.g., by dividing by $\rho(H)$) and expressed as a magnetoresistance ratio in percent.

Conventional materials (e.g., PERMALLOY) typically have a positive MR ratio of a few percent. Recently, relatively large values of MR ratio were observed in metallic multilayer structures, e.g., Fe/Cr or Cu/Co, e.g., as high as 40% at room temperature. See, for instance, E. F. Fullerton et. al., *Applied Physics Letters*, Vol. 63 (12), p. 1699, (1993), and S. S. P. Parkin et. al., *Physical Review Letters*, Vol. 66(16), p. 2152 (1991). High MR ratios at low temperature (typically below 50K) were also observed in $Eu_{1-x}Gd_xSe$. Values of MR substantially larger (in absolute value) than those of conventional materials are usually referred to as "giant" MR. See, for instance, P. M. Levy, *Science*, Vol. 256, p. 972 (1992), and J. Heremans, *J. Physics D:Applied Physics*, Vol. 26, p. 1149 (1993).

More recently still, giant MR ratios were observed in mixed metal oxides. K. Chahara et. al., *Applied Physics Letters*, Vol. 63(14), pp. 1990–1992 (1993), disclose $(\Delta\rho/\rho(H))$ of about $-110\%$ in $La_{0.72}Ca_{0.25}MnO_x$ at about 200K. The material exhibited essentially zero MR at room temperature.

R. von Helmolt et. al., *Physical Review Letters*, Vol. 71 (14), pp. 2331–2333 (1993) report observation of a room temperature MR ratio of about $-150\%$ in thin films of perovskite-like $La_{0.67}Ba_{0.33}MnO_x$. As-deposited films were paramagnetic, but after subsequent heat treatment (900° C., air, 12 hours) the samples exhibited a ferromagnetic magnetization curve. Bulk samples of that composition are known to be metallic ferromagnets, with Curie temperature of 343K, but small MR ratio.

U.S. patent application Ser. No. 08/154,766, filed Nov. 18, 1993 by S. Jin et. al., and incorporated heroin by reference, discloses mixed metal oxides that can exhibit a MR ratio of 200% or more (in absolute value) at room temperature. These very high MR ratios were typically attained at relatively high fields, e.g., at 6 Tesla. The prior application also discloses a method of making such material.

Although a high MR ratio is a generally desirable property of a magnetoresistive material, for many potential applications it would be desirable for the material to exhibit a significant change in resistivity in response to a change in the applied field at low values of applied magnetic field, e.g., at field values of 0.05 Tesla (i.e., 500 Oe) or less, since such fields can be readily provided by inexpensive and simple means. Furthermore, it would be highly desirable for the material to exhibit this significant change in resistivity at room temperature (25° C. or 298K), thereby avoiding the need for costly and inconvenient cooling apparatus. This application discloses such materials.

THE INVENTION

We have discovered that addition of a relatively small amount of Sr and/or Ba to La-Ca-Mn-O can result in material having a substantially larger (typically at least twice as large) value of $|d\rho/dH|$ at room temperature and in a small applied field H (exemplarily $H \leq 0.05$ T), than does the analogous La-Ca-Mn-O material at the same temperature and in the same field. Thus, in a broad aspect the invention is embodied in an article that comprises magnetoresistive material that can exhibit at 25° C. a relatively large change of resistance as a function of applied magnetic field, for relatively small applied magnetic fields.

More specifically, the invention is embodied in an article (e.g., apparatus that comprises magnetoresistive sensing means) that comprises a first material that exhibits magnetoresistance and comprises La, Ca, Mn and oxygen. Associated with the first material is a derivative $|d\rho/dH|$ at a given value of applied field H and temperature T, where $\rho$ is the electrical resistivity of the first material at the given values of H and T. The bars indicate absolute value.

Significantly, the first material further comprises a further constituent selected from Sr, Ba, and Sr and Ba. The amount of said constituent present in the first material is selected to provide the first material with a value of $|d\rho/dH|$ that is at least twice the absolute value of said derivative in a comparison material, to be referred to as the "second" material. The second material is identical to the first material except that the second material does not comprise said further constituent. The comparison is to be made at an applied magnetic field $\leq 0.05$ Tesla and at a temperature of 25° C. Exemplarily the first material exhibits $|\Delta\rho/\rho(H)|$ of at least 0.1%, preferably at least 0.3%, at H=0.05 Tesla and T=25° C., $|d\rho/dH|$ of at least $0.8 \times 10^{-2}$ and preferably at least $2.4 \times 10^{-2}$ $\mu\Omega\cdot$cm/Oe, and $\rho^{-1}|d\rho/dH|$ of at least $2 \times 10^{-6}$, preferably at least $6 \times 10^{-6}$/Oe. As is well known, 1 Tesla=$10^4$ Oersted.

FIG. 1 shows the resistance R (which is proportional to the resistivity $\rho$) of a sample (a film of approximate thickness 100 nm) of material of nominal composition $La_{0.67}Ca_{0.33}MnO_x$ ($x \sim 3$) as a function of applied field H, at T=260 (curve 10), 280 (curve 11) and 298K (curve 12), respectively. By "nominal composition" we mean herein a composition that departs from the recited composition at most by $\pm 10\%$ for any given constituent metal element.

As can be seen from FIG. 1, the material (which is not a material according to this invention) has a relatively large value of $|d\rho/dH|$ at 0.05 Tesla at 260K, has a moderate value of that derivative at 280K, and has a quite small value at room temperature (298K). The change in $|d\rho/dH|$ as a function of temperature indeed is surprisingly large. The material has utility for sensing purposes in a temperature range below 280K (e.g., at 260K), but is at best marginally useful at room temperature, due to its small value of $|d\rho/dH|$ at low field. At 260, 280 and 298K the material has a MR ratio respectively of 105, 36 and 11% in a field of 1.75 Tesla. Although MR ratio at a given field is not exactly proportional to $|d\rho/dH|$ at that field, both MR ratio and the derivative typically will increase or decrease together.

Figure 2:
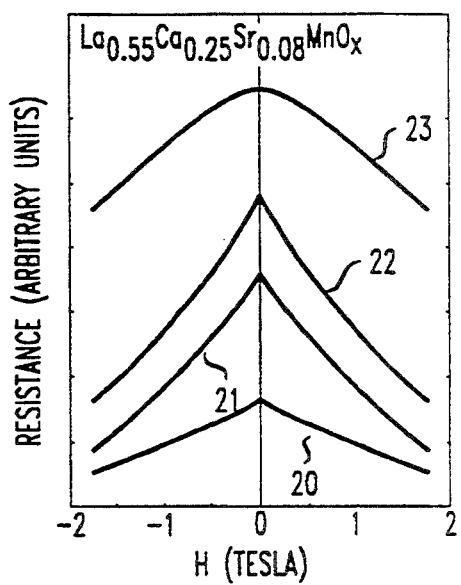

FIG. 2 shows analogous data for material according to the invention, namely, a film of nominal composition $La_{0.55}Ca_{0.25}Sr_{0.08}MnO_x$. Curves 20–23 were taken at 280, 298, 313 and 323K, respectively, and show that the material exhibits moderate values of $|d\rho/dH|$ at 280 and 323K, and substantially higher values over a temperature range that includes room temperature. At 280, 298, 313 and 323K in a 1.75 Tesla field the material had MR ratios respectively of 13, 39, 51 and 29%.

Figure 3:
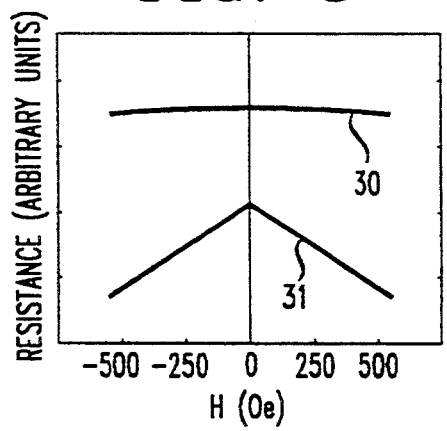

FIG. 3 further exemplifies the difference between material according to the invention and comparison material that does not contain the further constituent. Curve 30 pertains to material of nominal composition $La_{0.57}Ca_{0.33}MnO_x$, and curve 31 to material of nominal composition $La_{0.55}Ca_{0.25}Sr_{0.08}MnO_x$. Both materials were in the form of thin films (approximately 100 nm thick), and were deposited by laser ablation on (001) $LaAlO_3$ substrates, followed by heat treatment (950° C., 3 hours in 3 atmospheres of $O_2$). The material of curve 30 has MR ratio of 0.03% at 0.05 Tesla and 298K, whereas the material according to the invention (curve 31) has a MR ratio of 1.25% under the same conditions, an approximately 40-fold increase over the comparison material. The absolute value of $d\rho/dH$ of the material according to the invention similarly is many times larger than that of the comparison material, for relatively low values of H, e.g., for $H \leq 0.05$ Tesla, and for temperatures at or close to room temperature.

Exemplarily, a 3 mm×2 mm×100 nm film of the material according to the invention had zero field resistance ($R_o$) of about 600 Ω at 298K, corresponding to $\rho_o$ of about 4 mΩ·cm. We measured the voltage drop caused by a 1 mA current through the film in the conventional 4-point probe geometry. The change in voltage in response to a 0.05 Tesla field was 7.5 mV (corresponding to 15 μV/Oe) at room temperature. Under the same conditions the non-inventive material of FIG. 3 (which had substantially the same $R_o$) yielded a signal of only 0.18 mV (corresponding to 0.36 μV/Oe).

Although we consider a doubling of $|d\rho/dH|$ over that of the comparison material to be of commercial significance, preferred materials according to the invention will exhibit an at least 5-fold, more preferably at least 10-fold, increase of $|d\rho/dH|$ at 25° C. and relatively small H, as compared to the comparison material.

Those skilled in the art will recognize that the substantially linear relationship between $\rho$ and H (at low values of H) in the material according to the invention (see curve 31) is a very advantageous feature of the novel material, which inter alia facilitates use of the material for field sensing purposes. In preferred embodiments of the invention $|d\rho/dH|$ at room temperature varies by at most 30% over the range 0–0.05 Tesla, more preferably by at most 10%.

A further advantageous feature of material according to the invention is its relatively high resistivity at zero field ($\rho_o$), which facilitates use of relatively small currents and/or less sensitive signal amplifiers. For instance, a well-known prior art magnetoresistive sensor material (PERMALLOY, which exemplarily is a 80 Ni-20 Fe alloy and typically exhibits a MR ratio of up to about 3%) has $\rho_o$ of only about 0.04 mΩ·cm. Thus, for the same sensor current, the voltage output in a PERMALLOY-based field sensor would be orders of magnitude smaller than the output from an analogous sensor that utilizes material according to the invention, which typically has $\rho_o$ in the range 0.5–100 mΩ·cm at 298K.

Figure 4:
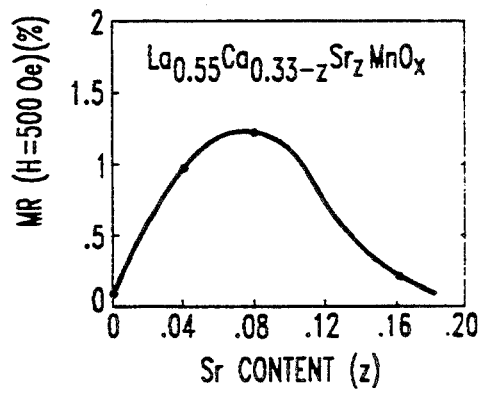

FIG. 4 shows exemplary data of MR ratio at H=0.05 Tesla vs. Sr content (z) in material according to the invention of nominal composition $La_{0.55}Ca_{0.33-z}Sr_zMnO_x$. As can be readily seen, the MR ratio (and thus $|d\rho/dH|$) is strongly dependent on the amount of Sr present, and addition of a very small amount of Sr can double the MR ratio of the material. Similar results are expected if Ba, or Ba and Sr, are the added constituent. Typically, for $z \leq 0.01$ and $z \geq 0.2$ the improvement in MR ratio is considered to be of marginal commercial significance, and such compositions are currently not preferred.

In preferred embodiments material according to the invention has nominal composition $La_wCa_{y-z}Z_zMn_vO_x$, where Z is Sr, Ba, or Sr and Ba, w is 0.45–0.85, z=0.01–0.20, v is 0.7–1.3, x is 2.3–3.5, and y-z is 0.1–0.45. More preferably, w is 0.50–0.75, z is 0.01–0.16, v is 0.8–1.2, x is 2.7–3.2, and y-z is 0.15–0.4. Still more preferably, w is 0.50–0.68, z is 0.01–0.12, v is 0.8–1.2, x is 2.7–3.2, and y-z is 0.2–0.35.

Material according to the invention can be in the form of thin films, preferably thin films that are epitaxial with an appropriate substrate, but not excluding polycrystalline (textured or untextured) films. It can also be bulk polycrystalline material or a single crystal.

Exemplary substrate materials are $LaAlO_3$, MgO, $SrTiO_3$, $Al_2O_3$, $SiO_2$, semiconductors such as Si, or appropriate metals or metal alloys. The substrate material can, but need not be, an integral part of the device that utilizes the inventive material. The use of a buffer layer to promote epitaxial growth or to provide electrical insulation between the film and a conductive substrate is contemplated.

Thin films of material according to the invention can be formed by any suitable physical or chemical deposition technique, e.g., sputtering, laser ablation, evaporation, molecular beam epitaxy, chemical vapor deposition, electroplating, electroless plating and plasma spray deposition, typically followed by an oxidation step. Laser ablation and off-axis sputtering are the currently preferred deposition techniques. As those skilled in the art know, these processes can readily yield a deposit that has substantially the same composition as the target.

Deposited films are generally heat treated, typically in the range 700°–1100° C. for 0.1–100 hours, preferably in the range 800°–1000° C. for 0.5–20 hours.

Bulk material according to the invention can be prepared in a variety of ways. Exemplarily, powder of the desired composition is formed by a process that comprises mixing of stoichiometric amounts of oxides of La, Ca, Sr and/or Ba, and Mn, maintaining the mixture for an extended period (e.g., 1–20 hours) at an elevated temperature (e.g., 900°–1400° C.) in an oxygen-containing atmosphere, cooling the resulting calcined material to room temperature and comminuting the calcined material. Optionally the calcining and comminuting steps are repeated one or more times. The thus produced powder can then be pressed into a desired form and sintered, typically in the range of 800°–1500° C. for 0.5–1000 hours, preferably 900°–1300° C. for 1–100 hours. The powder can also be mixed with a known carrier (e.g., polyvinyl alcohol and optional organic binder) to form a paste or slurry, and the mixture applied to a substrate by, e.g., a doctor blade, by screen printing or spray coating. After pyrolysis of the carrier the remaining material according to the invention is heat treated, substantially as described for bulk material.

Heat treatment of material according to the invention generally involves heating in an oxygen-containing atmosphere, typically in an atmosphere of more than 0.2 atmospheres $O_2$ partial pressure. The values of materials parameters such as MR ratio and $\rho_o$ will typically depend, at least to some degree, on the details of the heat treatment. The conditions that will result in a desired value of a given parameter or parameters typically cannot be specified in advance, but can typically readily be determined. Such determination is a simple matter for those skilled in the art.

Figure 5:
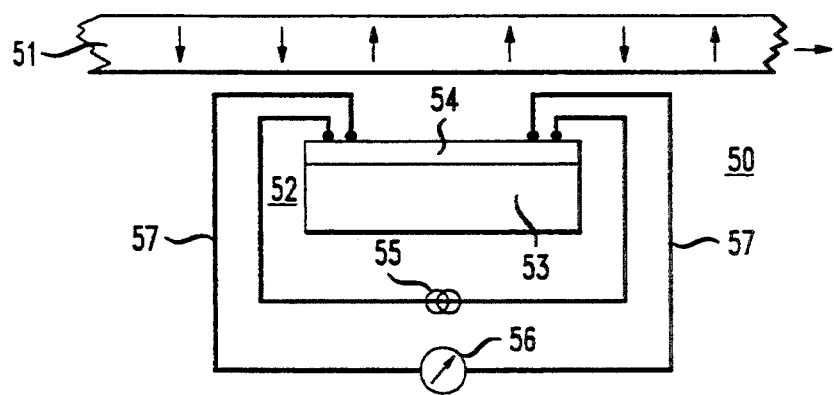

FIG. 5 schematically shows exemplary apparatus 50 according to the invention, namely, an apparatus that senses variations of magnetization in a magnetic tape 51, and provides a responsive voltage signal. The magnetic tape moves past sensing head 52, the latter comprising a substrate body 53 and a film 54 of inventive material thereon. Arrows indicate magnetization direction in the magnetic tape. Means 55 provide a DC current to film 54. The film is contacted by conductors 57, and voltage-responsive means 56 respond to the voltage across the magnetoresistive layer 54. J. Heremans (op. cit.) and U. Dibbern et. al., *Electronics Components and Applications*, Vol. 5(3), p. 148 (June 1983) provide background on magnetoresistive sensors and are incorporated herein by reference.

Example 1

A ceramic laser ablation target of nominal composition $La_{0.55}Ca_{0.25}Sr_{0.08}MnO_x$ was prepared as follows: stoichiometric amounts of oxide powders of La, Ca, Sr and Mn were mixed. The mixture was calcined at a temperature in the range 1200°–1300° C. for a time in the range 3–12 hours in oxygen, followed by conventional grinding. This process was repeated once. The resulting powder was pressed by conventional means into a 1 inch diameter × 0.2 inch thick disk, followed by sintering of the disk at 1300° C. for 16 hours in oxygen. Using the resulting sintered disk as the target, a thin film (about 100 nm thick) of nominal composition $La_{0.55}Ca_{0.25}Sr_{0.08}MnO_x$ was deposited on a $LaAlO_3$ substrate by conventional laser ablation in 100 mTorr $O_2$ partial pressure. The substrate temperature was 700° C. After completion of deposition the film was heat treated at 950° C. for 3 hours in about 3 atmospheres oxygen. A sample of approximate size 2×3 mm was prepared, and the resistivity of the material as a function of H was measured by means of a conventional 4-point probe technique. Currents in the range 0.10–10 mA were used, and the MR ratio was found to be essentially independent of the magnitude of the applied DC current. The MR ratio also was found to be essentially independent of the direction of H in the plane of the film. The measurement results were, inter alia, substantially as shown in FIGS. 2–3.

Example 2

A sample of approximate size 3×4×2 mm was cut from a sintered bar of nominal composition $La_{0.55}Ca_{0.25}Sr_{0.08}MnO_x$. The sintered bar was prepared substantially as the target disc of Example 1. The sample exhibited a MR ratio of about 1% at 0.05 T and 25° C.

We claim:

1. An article comprising a first material that exhibits magnetoresistance and comprises La, Ca, Mn and oxygen, associated with the first material is a derivative $|d\rho/dH|$ at a given value of applied field H and temperature T, where $\rho$ is the electrical resistivity of the first material at the given values of H and T;

CHARACTERIZED IN THAT
the first material comprises a further constituent selected from the group consisting of Sr, Ba, and Sr and Ba, the amount of said further constituent selected to provide said first material, at a given value of H less than or equal to 0.05 Tesla and at a temperaturer of 25° C., with a value of $|d\rho/dH|$ that is at least twice the value of said derivative associated, at the given values of H and T, with a second material that is identical to the first material except that the second material does not comprise said constituent.

2. An article according to claim 1, wherein $|d\rho/dH|$ of the first material is at least 10 times $|d\rho/dH|$ of the second material at the given values of H and T.

3. An article according to claim 1, wherein $|d\rho/dH|$ of the first material is at least $0.8 \times 10^{-2}$ $\mu\Omega\cdot cm/Oe$ at the given values of H and T.

4. An article according to claim 1, wherein the first material has composition $La_wCa_{y-z}Z_zMn_vO_x$, where Z is one or both of Sr and Ba, $0.45 \leq w \leq 0.85$, $0.01 \leq z \leq 0.20$, $0.7 \leq v \leq 1.3$, $2.3 \leq x \leq 3.5$, and $0.1 \leq y-z \leq 0.45$.

5. An article according to claim 4, wherein $0.50 \leq w \leq 0.75$, $z \leq 0.16$, $0.8 \leq v \leq 1.2$, $2.7 \leq x \leq 3.2$, and $0.15 \leq y-z \leq 0.40$.

6. An article according to claim 5, wherein $w \leq 0.68$, $z \leq 0.12$, and $0.2 \leq y-z \leq 0.35$.

7. An article according to claim 1, wherein the first material is a first material film disposed on a substrate.

8. An article according to claim 7, wherein the film is epitaxial with the substrate.

9. An article according to claim 1, wherein the first material comprises sintered first material powder.

10. An article according to claim 1, wherein the article further comprises means for flowing an electric current through said first material, and still further comprises means that are responsive to a change in a voltage across at least a portion of said first material.

11. An article according to claim 1, wherein the first material has a resistivity of at least 0.5 $m\Omega\cdot cm$ at 298K in zero magnetic field.

12. An article according to claim 1, wherein the value of $|d\rho/dH|$ of the first material varies by at most 30% over the range from 0–0.05 Tesla.

13. An article comprising a material that exhibits magnetoresistance that comprises La, Ca, Mn and oxygen, associated with the material being a derivative $|d\rho/dH|$ at a given value of applied field H and temperature T, where $\rho$ is the electrical resistivity;

CHARACTERIZED IN THAT
a) the material has composition $La_wCa_{y-z}Z_zMn_vO_x$, where Z is one or both of Sr and Ba, $0.45 \leq w \leq 0.85$, $0.01 \leq z \leq 0.20$, $0.7 \leq v \leq 1.3$, $2.3 \leq x \leq 3.5$, and $0.1 \leq y-z \leq 0.45$; and
b) $|d\rho/dH|$ is at least $0.8 \times 10^{-2}$ $\mu\Omega\cdot cm$ at T=25° C. and $H \leq 0.05$ Tesla.

14. An article according to claim 13, wherein $0.50 \leq w \leq 0.75$, $z \leq 0.16$, $0.8 \leq v \leq 1.2$, $2.7 \leq x \leq 3.2$, and $0.15 \leq \leq y-z \leq 0.40$, and wherein $|d\rho/dH|$ is at least $2.4 \times 10^{-2}$ $\mu\Omega\cdot cm/Oe$.

* * * * *